(12) United States Patent
Repede

(10) Patent No.: US 7,079,983 B2
(45) Date of Patent: Jul. 18, 2006

(54) METHOD, APPARATUS AND COMPUTER PROGRAM PRODUCT FOR IMPLEMENTING PHYSICAL INTERCONNECT FAULT SOURCE IDENTIFICATION

(75) Inventor: Michael Thomas Repede, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/835,465

(22) Filed: Apr. 29, 2004

(65) Prior Publication Data

US 2005/0246126 A1    Nov. 3, 2005

(51) Int. Cl.
*G06F 15/00* (2006.01)

(52) U.S. Cl. ...................................... 702/185
(58) Field of Classification Search ................... 714/56
See application file for complete search history.

(56) References Cited

U.S. PATENT DOCUMENTS

| | | | |
|---|---|---|---|
| 5,691,991 A | 11/1997 | Kessler et al. | |
| 5,717,701 A | 2/1998 | Angelotti et al. | |
| 5,808,919 A * | 9/1998 | Preist et al. | 702/183 |
| 6,810,510 B1 * | 10/2004 | Bakarian et al. | 716/5 |
| 6,848,094 B1 * | 1/2005 | Andreev et al. | 716/12 |
| 2002/0078402 A1 | 6/2002 | Douskey et al. | |

* cited by examiner

*Primary Examiner*—John Barlow
*Assistant Examiner*—Jonathan Moffat
(74) *Attorney, Agent, or Firm*—Joan Pennington

(57) ABSTRACT

A method, apparatus and computer program product are provided for implementing physical interconnect fault source identification. Interconnect test data are processed and each unique failing chip combination is identified. Each common failing chip of the identified unique failing chip combinations is identified. A selected probability failure is reported for each identified common failing chip.

20 Claims, 5 Drawing Sheets

METHOD, APPARATUS AND COMPUTER PROGRAM PRODUCT FOR IMPLEMENTING PHYSICAL INTERCONNECT FAULT SOURCE IDENTIFICATION

FIELD OF THE INVENTION

The present invention relates generally to the data processing field, and more particularly, relates to a method, apparatus and computer program product for implementing physical interconnect fault source identification.

DESCRIPTION OF THE RELATED ART

System-level nets connect two or more semiconductor devices. Possible faults on these interconnects include shorted signal nets, shorts to power or ground, and open connections. Since these nets often cross package, module, and/or card boundaries, they cannot be fully tested until the system is completely built. This limitation, coupled with the unpredictable nature of many fault conditions, makes debug quite difficult and time-consuming. On larger systems the problem is made worse by more complex interconnect schemes such as multi-drop nets with three or more chips, as well as higher fallout rates due to increased part volumes.

Various tests are used to methodically exercise system interconnects in order to detect and report faults requiring repair.

For example, U.S. Pat. No. 5,717,701 to Angelotti et al., issued Feb. 10, 1998 and assigned to the present assignee, discloses a boundary scan register that allows for simplified testing of interconnections between integrated circuits. The interconnections between integrated circuits are characterized according to net type. Each net type has one or more mask registers that drive control inputs to each boundary scan register that drives a net of that type. One integrated circuit is configured to drive, while the others are configured to receive. The boundary scan registers are initialized to predetermined values, the mask registers are loaded, and clocks are pulsed to perform the needed tests. The results are then scanned out of the boundary scan registers, and a compression circuit compresses the test results data.

U.S. patent application US 20020078402A1 to Douskey et al., published Jun. 20, 2002 and assigned to the present assignee, discloses a method, program and system for electrical shorts testing. The disclosed invention comprises setting any chips to be tested to drive 0's on their drive interfaces, and setting all receive interfaces on the chips to receive 0's and log any failures. Next a single receive interface is selected for testing. A hardware shift register is associated with each drive side interface, wherein each bit of the register is connected to an off-chip driver on the interface. This hardware shift register for the selected interface is then set to all 0's, and the first bit of the shift register is loaded to a 1. The invention then performs a pause count. After this count, the 1 is shifted to the next bit in the register and another pause count is performed. This process is repeated until the 1 is walked completely through the register and all pins on the interface have been tested. The walking 1 test is then repeated for any additional interfaces that require testing. Any nets not controlled by the new Electrical Shorts Test (EST) should ideally be set to drive 1 during this walking 1 test. In addition, an inverted shorts test can be performed in which the 1 and 0 values are reversed and a walking 0 test is performed through the register, thus allowing the interfaces to be tested at both polarities. Nets not controlled by the new EST should be driven to 0 during the Inverted test.

A problem with various known testing arrangements is that one faulty net typically points to two or more replaceable units, and a judgment must be made about which one to replace. An additional complication is that nets on a given system often fall out in large numbers, resulting in a significant amount of fail data that points to several replaceable units. The challenge is to summarize all this information such that each faulty part can be replaced as quickly as possible. Efficient fixes are desired in manufacturing for cost savings reasons. Minimizing downtime in the field, such as in a hardware upgrade situation, can be even more important for customer satisfaction.

Currently the IBM eServer iSeries and pSeries system interconnect test code reports all possible failing parts. In essence, every chip connected to a failing net is reported. Often three or more replaceable units are called out, though only one is actually faulty. Additional error logs are available for post-processing, in order to isolate the failure to one part. However, such post-processing is a manual process that requires training and experience. Also the logs are only accessible in manufacturing and lab environments, not in the field.

U.S. Pat. No. 5,691,991 to Kessler et al., issued Nov. 25, 1997 and assigned to the present assignee, discloses a process for diagnosing test result data produced during boundary scan testing of a circuit device having a plurality of boundary scan latches at endpoints interconnected in a plurality of nets. The process identifies the particular endpoint that is defective out of all the endpoints in a defective net so that a repair can be efficiently directed to the identified endpoint. The process looks for recognizable patterns of failures in failure data resulting from each test pattern in a boundary scan test, particularly the symptom pattern of a failed endpoint that fails to drive all other endpoints on the net when acting as a driver and fails to receive data from all other endpoints when acting as a receiver.

A new method is needed for diagnosing a physical interconnect fault source for present systems where many system interconnects are point-to-point For example, today many system connections are made through line grid array cinch interposers as opposed to metal pins that plug into sockets. The physical nature of such cinch connectors, as well as the high pad density used in current system modules, causes fallout to be dramatic. That is, when a module is not seated properly, many nets fail. If a module is not tightened down enough, hundreds of open connections may result. If it is incorrectly aligned, an equal number of shorts may occur. All of these nets are detected as failing, and a significant amount of failure data is generated. Often a problem like this is limited to one bad or improperly connected module, and is quite easy to fix. Unfortunately, with known testing arrangements, an error report usually calls out several parts, resulting in confusion and unnecessary down time.

When interconnect failure is limited to one physical fault such as a bad card trace or a single bent pin, detailed information about the misbehaving net is useful for debug and failure analysis. However, when fallout appears to be significant and a quick fix is necessary, a simple failure summary is much more desirable.

SUMMARY OF THE INVENTION

Principal aspects of the present invention are to provide a method, apparatus and computer program product for implementing physical interconnect fault source identification. Other important aspects of the present invention are to provide such method, apparatus and computer program product for implementing physical interconnect fault source identification substantially without negative effect and that overcome many of the disadvantages of prior art arrangements.

In brief, a method, apparatus and computer program product are provided for implementing physical interconnect fault source identification. Interconnect test data are processed and each unique failing chip combination is identified. Each common failing chip of the identified unique failing chip combinations is identified. A high probability failure is reported for each identified common failing chip having a count value above a set threshold.

In accordance with features of the invention, a net naming algorithm is provided for assigning unique patterned names for all system nets. Then redundant failing chip combinations are eliminated using the net naming algorithm. A low probability failure is reported for each identified common failing chip having a count value less than or equal to the set threshold. The high probability failure is reported for each said identified common failing chip having a count value greater than one.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided that automates the process of isolating faulty parts by incorporating the physical interconnect fault source identification within the test code. The method of the invention substantially removes human error, speeds turnaround times, and is made available for use in field environments in addition to manufacturing and lab environments.

In accordance with features of the invention, a function is added to the interconnect test code, creating an automated method of processing large amounts of interconnect fail data and reporting a simple summary. Today this analysis is done by human-interpretation that includes parsing raw data, searching for patterns by eye, and referencing system interconnect documents. This system can be effective, but is inefficient and error-prone, and the detailed failure information is not available in the field, where time costs a premium. As part of the test code of the invention, the automated analysis can run on every failing system regardless of location or environment.

Figure 1:
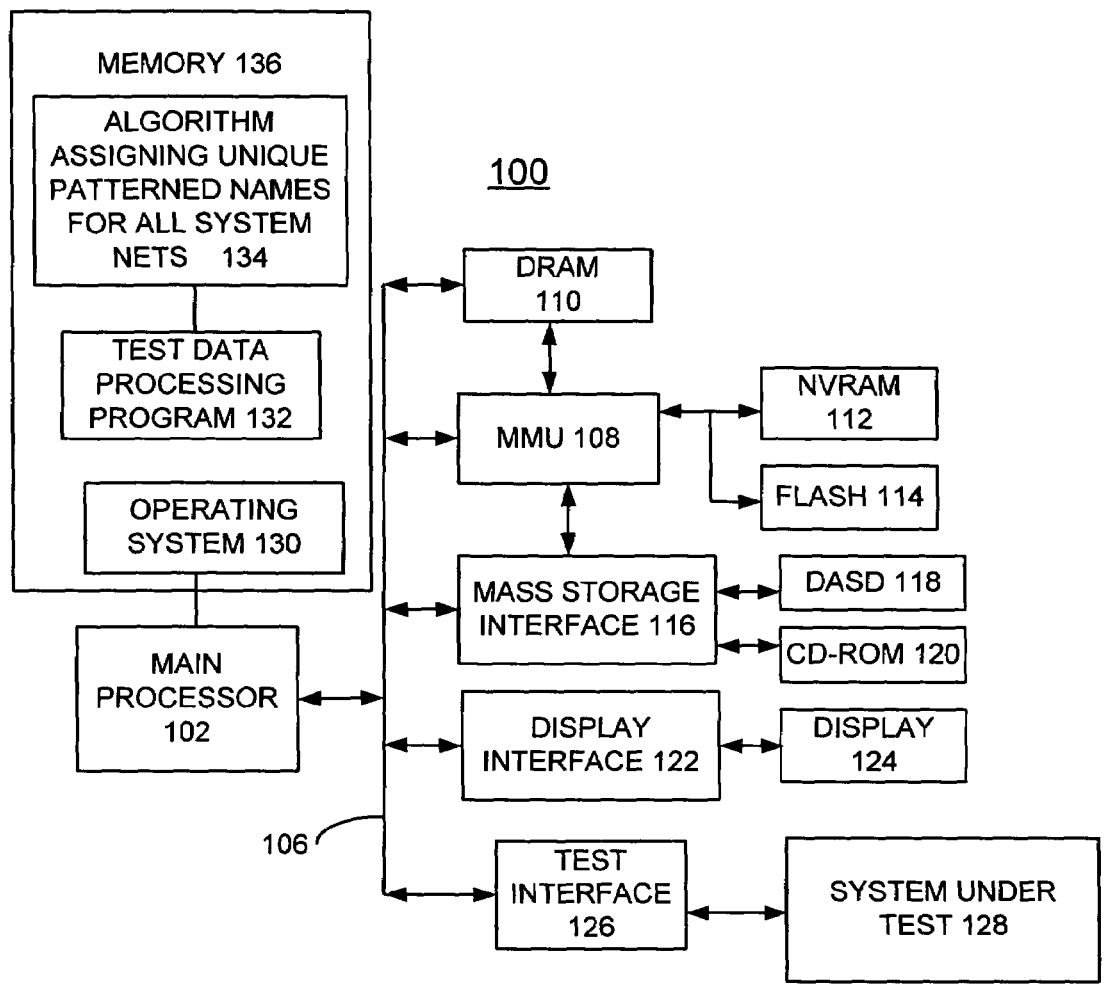
FIG. 1 is a block diagram representations illustrating an exemplary computer test system for implementing physical interconnect fault source identification in accordance with the preferred embodiment.

Referring now to the drawings, in FIG. 1 there is shown an exemplary computer test system generally designated by the reference character 100 for implementing physical interconnect fault source identification in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. A system under test 128 is coupled to the test interface 126. The system under test 128 includes, for example, a system including a plurality of integrated circuit chips or devices. Computer system 100 includes an operating system 130, a test data processing program 132 of the preferred embodiment, and a net naming algorithm 134 of the preferred embodiment resident in a memory 136.

The net naming algorithm 134 of the preferred embodiment assigns unique patterned names for all nets in a system under test 128. It should be understood that the names of the system nets could be arbitrarily assigned so long as tables are available to interpret these names and provide necessary information. A regular pattern, however, eliminates the need to store such tables and also allows net names to be human readable as an added feature. Regardless of the net naming convention, embedded in the name is information about which chips are connected to it. For example, if chip A and chip B are connected via a point-to-point bus 16 bits wide, the net names are for example, AB00, AB01, . . . , AB15.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2:
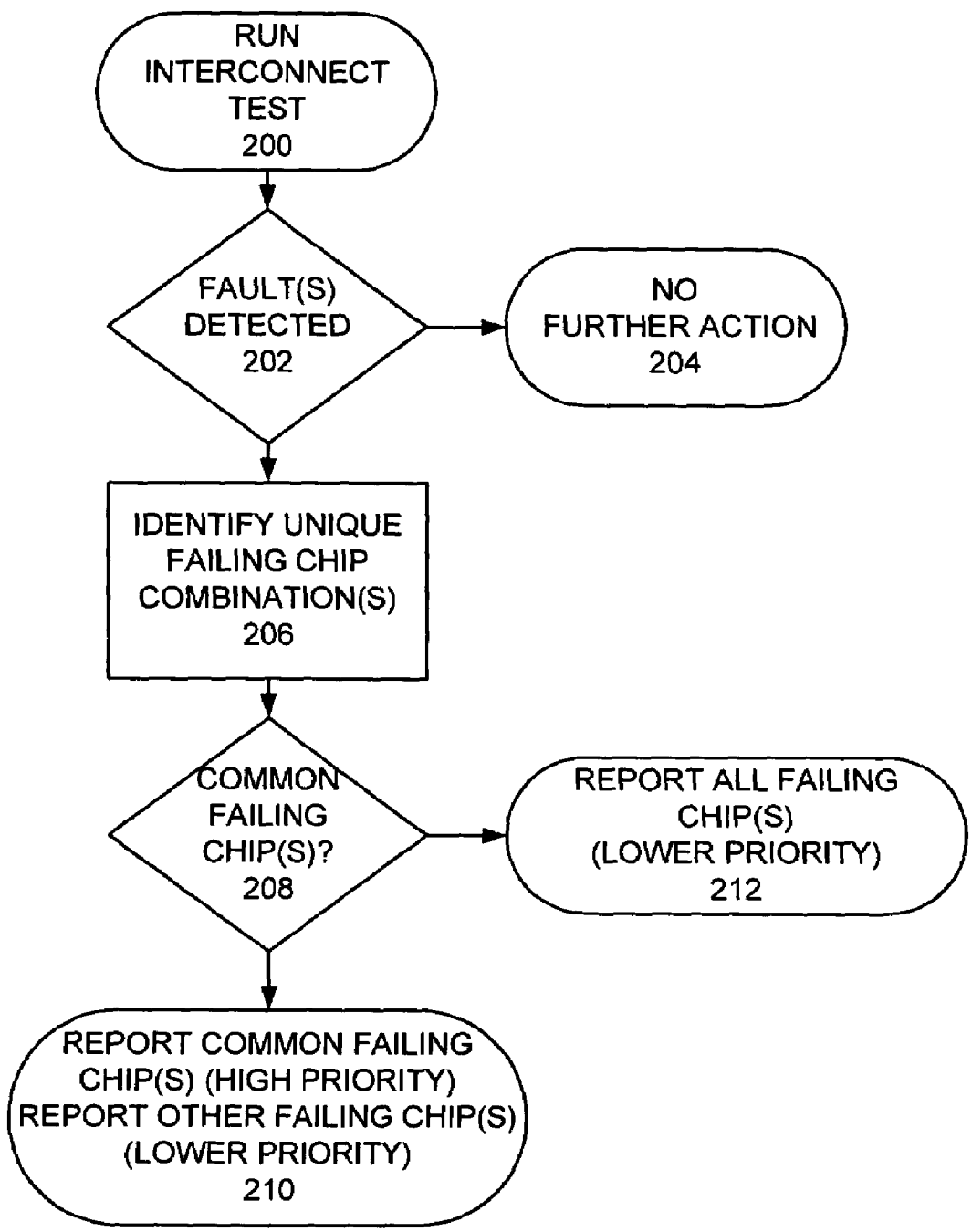
FIG. 2 is a flow chart illustrating exemplary steps for implementing physical interconnect fault source identification in accordance with the preferred embodiment.

Referring now to FIG. 2, there are shown exemplary steps for implementing physical interconnect fault source identification in accordance with the preferred embodiment starting at a block 200 with running an interconnect test. Checking for faults is performed as indicated in a decision block 202. If no faults are detected, no further action is required as indicated in a block 204. If faults are detected, further processing begins to identify unique failing chip combinations as indicated in a block 206. While running the interconnect test, all failing net numbers are stored in an error log. The first step in post-processing is to identify unique failing chip combinations at block 206.

For example, if an entire bus of nets connecting two chips failed, this is identified by the chip pair. Following the above exemplary net naming convention, if nets AB00, AB01, . . . , AB15 all failed, Chip A and Chip B form the unique failing chip combination. For the sake of simplicity, this is called pair AB.

Next checking for common failing chips is performed as indicated in a decision block 208. It is likely that there will be more than one unique failing chip combination.

Figure 3:
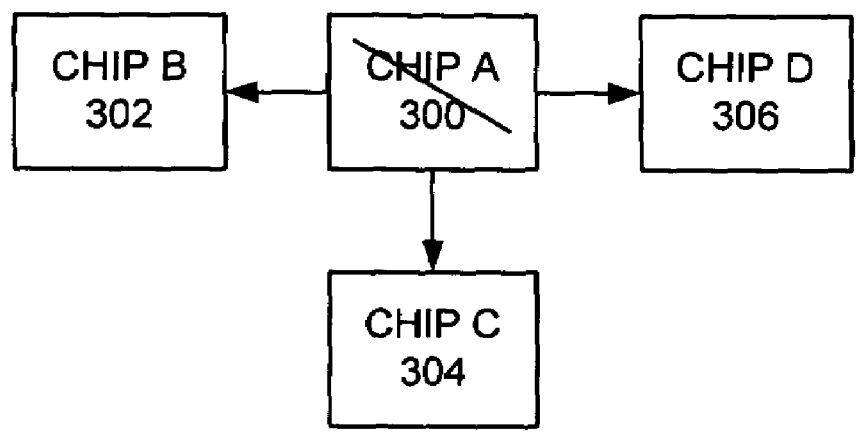
FIGS. 3, 4, and 5 are diagrams of exemplary arrangements for use in accordance with the preferred embodiment.

Referring also to FIG. 3, there is shown an exemplary system under test 128 including Chip A, 300 that is connected to Chip B, 302, Chip C, 304 and Chip D 306. Assuming a point-to-point interconnect scheme like the one shown in FIG. 3, if Chip A is connected improperly as indicated by a line through chip A, 300, the failing combinations AB, AC, and AD result. The step at block 208 to identify each common failing chip is done by tallying the number of failing combinations where each failing chip appears. For this case, the resulting tally would be A-3, B-1, C-1, D-1.

Any chip with a count greater than a set threshold value is reported with a higher priority and other failing chips with a count less than or equal to the set threshold value are reported with a lower priority as indicated in a block 210. For example, any chip with a count greater than 1 is common to multiple fail combinations and has a higher probability of being a faulty part.

In this example, A is the only chip with a count greater than one and is thus recognized as the chip common to the failing combinations AB, AC, and AD. Since there is a high probability that all detected physical faults are associated with Chip A, it will be called out with a higher replacement priority as indicated in a block 210. For completeness, chips with a count of one or below a predefined set threshold that is set for the higher replacement priority (chips B, C, and D) also are reported, but with a lower replacement priority at block 210. If no common failing chips or parts are detected at decision block 208, all the failing chips are called out with the same, lower replacement priority as indicated in a block 212.

FIG. 3 provides an example of the simple case of point-to-point nets to illustrate the fault isolation method of the preferred embodiment. It should be understood that the reasoning and process of the fault isolation method of the preferred embodiment advantageously is used on systems with more complex interconnect schemes.

Figure 4:
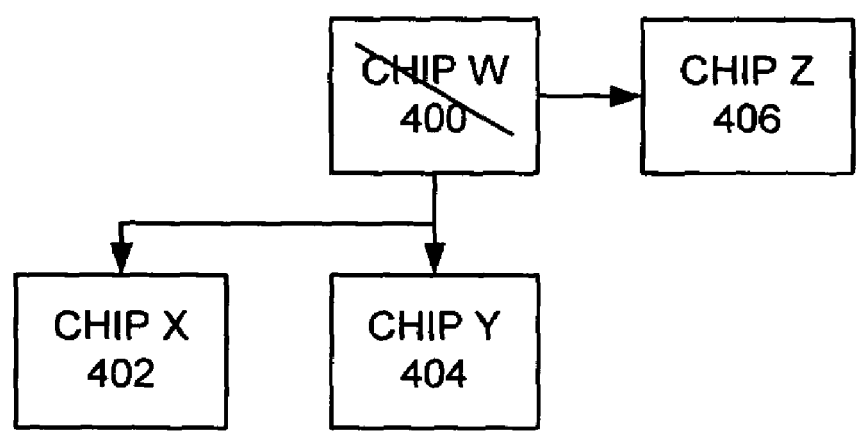

Referring also to FIG. 4, there is shown an exemplary system under test 128 including Chip W, 400 that is connected via a multi-drop connection to Chip X, 402 and Chip Y, 404 and includes a point-to-point connection to Chip Z 406. In the case of multi-drop nets with three or more connections, as shown in FIG. 4, the fault isolation method of the preferred embodiment advantageously is applied.

Assuming chip W contains faulty connections as indicated by a line through chip W, 400, unique failing chip combinations are WXY and WZ identified at block 206. The tally in this case is W-2, X-1, Y-1, Z-1 and the common failing part is chip W identified at decision block 208. Chip W has a greater probability of being the faulty part and is reported with a higher replacement priority at block 210.

The system diagrams provided for illustration in FIGS. 3 and 4 are simple, but it should be understood that the method of the invention applies to increasingly complex systems as well. Regardless of the interconnect topology, common failing parts can be singled out. For example, assume a system is comprised of both FIGS. 3 and 4. When chips A and W contain the faults, unique fail combinations are AB, AC, AD, WXY, and WZ. The tally identified at decision block 208 is then A-3, B-1, C-1, D-1, W-2, X-1, Y-1, Z-1. After searching for common parts with a tally greater than one or other predefined threshold, A-3 and W-2 emerge. Then A and W are reported with a higher replacement priority at block 210. B, C, D, X, Y, and Z will also be reported, but at a lower priority at block 210.

One additional point worth noting is that none of the above reasoning assumes any direction association of nets. FIGS. 3 and 4 are drawn with unidirectional connections, but bidirectional (point-to-point) or omni directional (multi-drop) nets are tested, reported, and analyzed in the same manner in accordance with the method of the preferred embodiment.

Figure 5:
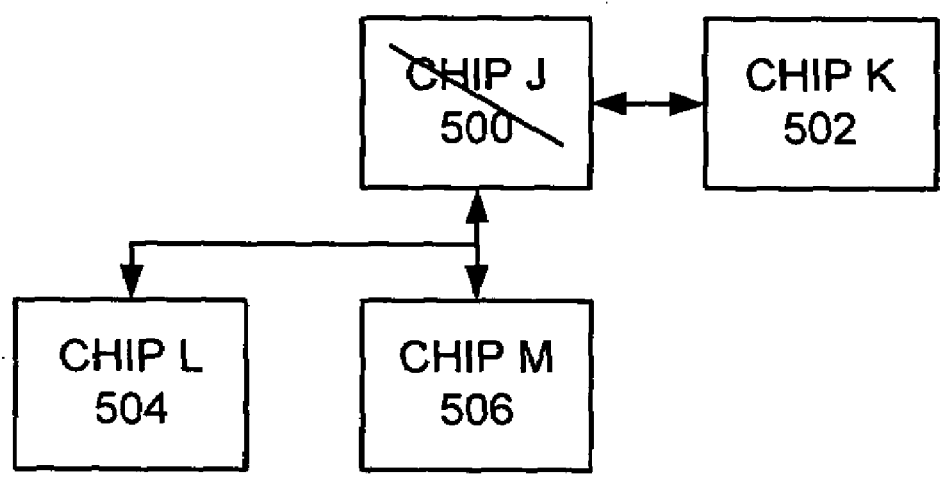

Having reference now to FIG. 5. there is shown an exemplary system under test 128 including Chip J, 500, to illustrate this point, assume a chip J, 500 contains all the faults. The chip J, 500 is connected by bidirectional (point-to-point) nets to chip K, 502 and is connected by omni directional (multi-drop) nets to chip L, 504 and chip M, 506. Also assume the net naming convention depends on the direction the net is driven, with the driving chip being the first one named in the net. So when Chip J drives, the nets include, for example, JKxx and JLMxx where xx indicates bus bits. If J receives, the nets would be KJxx, LMJxx, and MLJxx. In this scenario, a faulty chip J would generate two sets of failing chip combinations: one when the faulty chip J is driving and one when the faulty chip J is receiving. The drive set includes JK and JLM. The receive set includes KJ, LMJ, and MU. Then at block 206 in FIG. 2, unique chip combinations, regardless of order, are identified. So chip combinations JK and KJ are treated as redundant and simplified to a single chip combination JK. Similarly, a list such as chip combinations JLM, LMJ, and MU is simplified to a single chip combination JLM. After the list is reduced to chip combinations JK, JLM, the tally becomes J-2, K-1, L-1, M-1. Since J has a count greater than one, it is reported with a high replacement priority and K, L, and M are reported with lower priority at block 210 in FIG. 2. Obviously complex interconnect schemes require a more thorough net naming convention and more sophisticated post-processing code. Regardless, the algorithm of the preferred embodiment remains the same.

As systems increase in size and complexity, and service processor memory is reduced in order to cut costs, test applications must become more efficient. In the algorithm of the invention as illustrated in FIG. 2, the full interconnect test is run at block 200 and all failing nets are stored, for example, in a log, then fault isolation processing occurs. If the error log has no size limit, this solution is sufficient. Often, however, this is not the case. It should be understood that to address storage limitations, the algorithm of the invention can be used to process failure data as it is gathered, rather than post-processing stored failing nets data. With a co-processing system in place, redundant fail data can be disregarded, rather than stored as it is gathered. This would make room for more meaningful information.

Different environments often dictate unique requirements, and the desired approach may be to co-process the data in order to selectively store failure data. For example, a mode switch may be used to turn on varying degrees of redundant data filtering, depending on the environment of the system under test. In current IBM eServer iSeries and pSeries designs, this switch is known as an IPL mode with options being fast, slow, and manufacturing for various levels of testing and error threshold. For the interconnect test error processing technique of the preferred embodiment, manufacturing mode could indicate fully detailed error storage and reporting. Fast mode would run minimal tests, store only unique and necessary data, and report just a summary. Slow mode might be somewhere in between the manufacturing mode and the fast mode.

Figure 6:
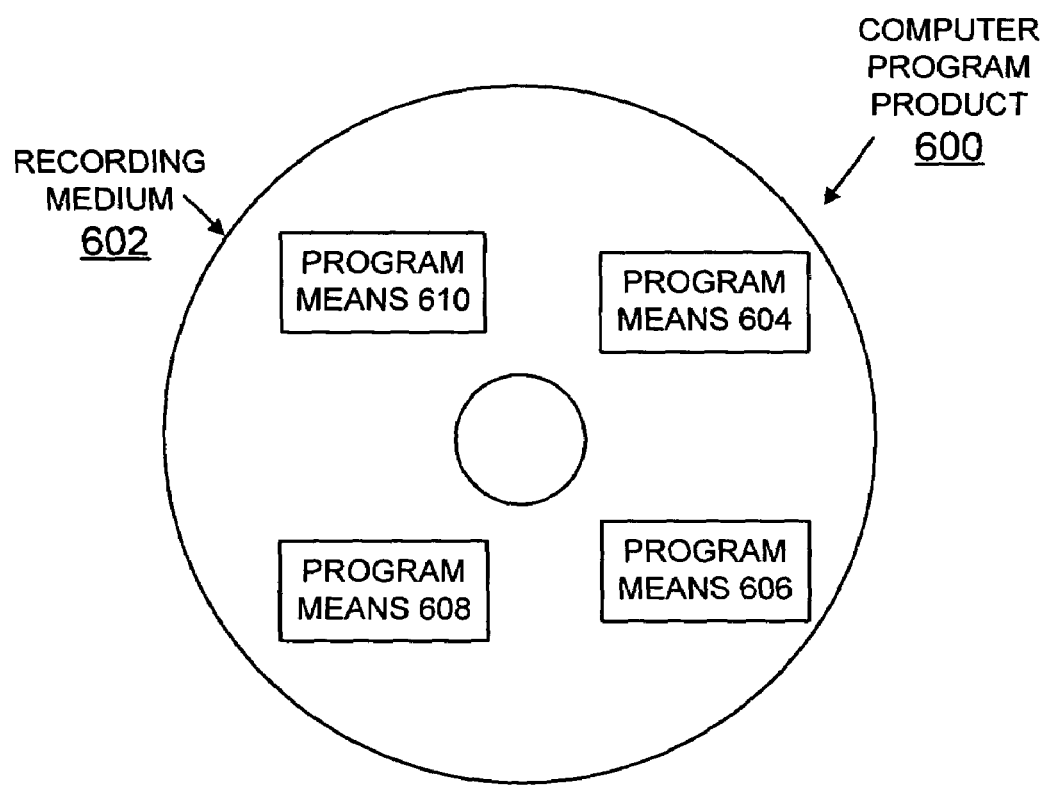
FIG. 6 is a block diagram illustrating a computer program product in accordance with the preferred embodiment.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, a transmission type media such as a digital or analog communications link, or a similar computer program product. Recording medium 602 stores program means 604, 606, 608, 610 on the medium 602 for carrying out the methods for implementing physical interconnect fault source identification of the preferred embodiment in the computer test system 100 of FIG. 1.

A sequence of program instructions or a logical assembly of one or more interrelated modules defined by the recorded program means 604, 606, 608, 610, direct the computer test system 100 for implementing physical interconnect fault source identification of the preferred embodiment.

While the present invention has been described with reference to the details of the embodiments of the invention shown in the drawing, these details are not intended to limit the scope of the invention as claimed in the appended claims.

What is claimed is:

1. A method for implementing physical interconnect fault source identification comprising the steps of:
    providing a net naming algorithm for assigning unique patterned names for all system nets; said unique patterned names for all system nets including embedded data identifying each connected chip for each assigned unique patterned name;
    running an interconnect test for a system under test;
    checking for faults;
    responsive to detecting faults, processing interconnect test data from said interconnect test for the system under test and identifying unique failing chip combinations by eliminating redundant failing chip combinations using said net naming algorithm;
    providing a respective count value for each identified unique connected chip, wherein said count value is defined as the number of said identified unique failing chip combinations in which the respective chip appears; and
    reporting a high probability failure for each said identified common failing chip having said count value above a set threshold.

2. A method for implementing physical interconnect fault source identification as recited in claim 1 wherein the steps of processing interconnect test data from said interconnect test for the system under test includes identifying failing nets and using said unique patterned names for identifying unique failing chip combinations.

3. A method for implementing physical interconnect fault source identification as recited in claim 2 wherein the step of identifying unique failing chip combinations includes the steps of gathering and processing interconnect test data simultaneously.

4. A method for implementing physical interconnect fault source identification as recited in claim 1 wherein the step of reporting a high probability failure for each said identified common failing chip having a count value above a set threshold includes the steps reporting a high probability failure for each said identified common failing chip having said count value greater than one.

5. A method for implementing physical interconnect fault source identification as recited in claim 1 further includes the steps of reporting a low probability failure for each said identified common failing chip having said count value less than or equal to said set threshold.

6. A method for implementing physical interconnect fault source identification as recited in claim 1 includes the steps of reporting a low probability failure for each said identified common failing chip having said count value of one.

7. A method for implementing physical interconnect fault source identification as recited in claim 1 further includes the steps of reporting a low probability failure for each identified failing chip.

8. A computer program product for implementing physical interconnect fault source identification of a system under test with a computer test system, said computer program product including instructions executed by the computer test system to cause the computer system to perform the steps of:
    providing a net naming algorithm for assigning unique patterned names for all system nets; said unique patterned names for all system nets including embedded data identifying each connected chip for each assigned unique patterned name;
    running an interconnect test for a system under test;
    checking for faults;
    responsive to detecting faults, processing interconnect test data from said interconnect test for the system under test and identifying unique failing chip combinations by eliminating redundant failing chip combinations using said net naming algorithm;
    providing a respective count value for each identified unique connected chip, wherein said count value is defined as the number of said identified unique failing chip combinations in which the respective chip appears; and
    reporting a high probability failure for each said identified common failing chip having said count value above a set threshold.

9. A computer program product for implementing physical interconnect fault source identification as recited in claim 8 wherein the steps of processing interconnect test data from said interconnect test for the system under test includes identifying failing nets and using said unique patterned names for identifying unique failing chip combinations.

10. A computer program product for implementing physical interconnect fault source identification as recited in claim 9 further includes the steps of gathering and processing interconnect test data simultaneously.

11. A computer program product for implementing physical interconnect fault source identification as recited in claim 8 wherein the step of reporting a high probability failure for each said identified common failing chip having a count value above a set threshold includes the steps reporting a high probability failure for each said identified common failing chip having said count value greater than one.

12. A computer program product for implementing physical interconnect fault source identification as recited in claim 8 further includes the steps of reporting a low probability failure for each said identified common failing chip having said count value less than or equal to said set threshold.

13. A computer program product for implementing physical interconnect fault source identification as recited in claim 8 includes the steps of reporting a low probability failure for each said identified common failing chip having said count value of one.

14. A computer program product for implementing physical interconnect fault source identification as recited in claim 8 further includes the steps of reporting a low probability failure for each identified failing chip.

15. Apparatus for implementing physical interconnect fault source identification of a system under test comprising:
    a net naming algorithm for assigning unique patterned names for each net of the system under test; said unique patterned names for all system nets including embedded data identifying each connected chin for each assigned unique patterned name; and
    a test data processing program for running an interconnect test for a system under test; for checking for faults; responsive to detecting faults, for processing interconnect test data from said interconnect test for the system under test and for identifying unique failing chip combinations by eliminating redundant failing chip combinations using said net naming algorithm; providing a respective count value for each identified unique connected chip, wherein said count value is defined as the number of said identified unique failing chip combinations in which the respective chip appears; and reporting a high probability failure for each said identified common failing chip having a said count value above a set threshold.

16. Apparatus for implementing physical interconnect fault source identification as recited in claim 15 wherein said test data processing program uses said net naming algorithm for eliminating redundant failing chip combinations simultaneously gathers and processes interconnect test data for identifying unique failing chip combinations.

17. Apparatus for implementing physical interconnect fault source identification as recited in claim 15 wherein said test data processing program reports said high probability failure for each said identified common failing chip having said count value greater than one.

18. Apparatus for implementing physical interconnect fault source identification as recited in claim 15 wherein said test data processing program reports a low probability failure for each said identified common failing chip having said count value less than or equal to said set threshold.

19. Apparatus for implementing physical interconnect fault source identification as recited in claim 15 wherein said test data processing program reports a low probability failure for each said identified common failing chip having said count value of one.

20. Apparatus for implementing physical interconnect fault source identification as recited in claim 15 wherein said test data processing program reports a low probability failure for each said identified failing chip.

* * * * *